United States Patent
Mays et al.

(10) Patent No.: US 10,490,725 B2
(45) Date of Patent: Nov. 26, 2019

(54) DRY, LOW-NOX COMBUSTOR WITH INTEGRATED THERMOELECTRIC GENERATOR

(71) Applicant: GAS TECHNOLOGY INSTITUTE, Des Plaines, IL (US)

(72) Inventors: Jeffrey A. Mays, Woodland Hills, CA (US); Shinjiro Miyata, Malibu, CA (US); Patrick E. Frye, Santa Monica, CA (US); Kyle Mays, Woodland Hills, CA (US)

(73) Assignee: GAS TECHNOLOGY INSTITUTE, Des Plaines, IL (US)

( * ) Notice: Subject to any disclaimer, the term of this patent is extended or adjusted under 35 U.S.C. 154(b) by 96 days.

(21) Appl. No.: 15/361,976

(22) Filed: Nov. 28, 2016

(65) Prior Publication Data
US 2018/0151791 A1    May 31, 2018

(51) Int. Cl.
| | | |
|---|---|---|
| *H01L 35/30* | (2006.01) | |
| *E21B 41/00* | (2006.01) | |
| *H01L 35/32* | (2006.01) | |
| *H01L 35/00* | (2006.01) | |
| *H01L 35/34* | (2006.01) | |

(52) U.S. Cl.
CPC .............. *H01L 35/30* (2013.01); *E21B 41/00* (2013.01); *H01L 35/32* (2013.01); *H01L 35/00* (2013.01); *H01L 35/34* (2013.01)

(58) Field of Classification Search
CPC .......... H01L 35/30; H01L 35/32; E21B 41/30
See application file for complete search history.

(56) References Cited

U.S. PATENT DOCUMENTS

| | | |
|---|---|---|
| 1,744,453 A | 1/1930 | Dressler |
| 3,056,848 A | 10/1962 | Meyers |
| 3,150,656 A | 9/1964 | Huber |

(Continued)

FOREIGN PATENT DOCUMENTS

WO    WO 2014/173502 A1    10/2014

OTHER PUBLICATIONS

PCT International Search Report, Form PCT/ISA/210, dated Dec. 26, 2017, (3 pages).

(Continued)

*Primary Examiner* — Matthew T Martin
(74) *Attorney, Agent, or Firm* — Pauley Erickson & Kottis

(57) ABSTRACT

An integrated combustor-thermoelectric generator and method for producing electrical power and/or for operating a pneumatic device. A thermoelectric generator includes a fuel and air mixture chamber with a combustor connected to the mixture chamber. The combustor including a longitudinal centerbody comprising a varying cross-sectional area along an axial length of the centerbody and a plurality of thermoelectric couples and/or modules disposed axially along sides of the centerbody. The thermoelectric generator can be paired with a DC air compressor for operating a pneumatic device by directing heated gases from the combustor to a plurality of thermoelectric couples and/or modules, and powering the air compressor with the thermoelectric couples and/or modules. The thermoelectric generator and DC compressor can be installed to a natural gas source at a well pad for operating a pneumatic device at the well pad.

20 Claims, 2 Drawing Sheets

(56) References Cited

U.S. PATENT DOCUMENTS

| | | | |
|---|---|---|---|
| 3,185,201 A | | 5/1965 | Herbst et al. |
| 3,428,496 A | | 2/1969 | Lockwood |
| 3,899,359 A | | 8/1975 | Stachurski |
| 4,942,863 A | | 7/1990 | Chou et al. |
| 5,450,869 A | | 9/1995 | Brittain et al. |
| 5,625,245 A | | 4/1997 | Bass |
| 5,793,119 A | * | 8/1998 | Zinke .................. F23C 15/00 126/110 E |
| 6,951,456 B2 | | 10/2005 | Cohen et al. |
| 8,614,392 B1 | | 12/2013 | Hsu et al. |
| 2011/0239635 A1 | | 10/2011 | Prior et al. |
| 2013/0087487 A1 | | 4/2013 | Duesel, Jr. et al. |

OTHER PUBLICATIONS

PCT Written Opinion of the International Searching Authority, Form PCT/ISA/237, dated Dec. 26, 2017, (7 pages).

\* cited by examiner

DRY, LOW-NOX COMBUSTOR WITH INTEGRATED THERMOELECTRIC GENERATOR

BACKGROUND OF THE INVENTION

Field of the Invention

This invention relates to power generation, and more particularly, provides a method and apparatus for generating power and pneumatic action through a thermoelectric generator device.

Description of Related Art

Gas and oil field operation constitutes one of the more significant sources of greenhouse gas (GHG) emissions. Methane emissions are a significant issue due to the Greenhouse Gas Intensification factor and the amount of methane that is produced. A major gas leakage source is emissions from natural gas operated pneumatic devices. Approximately 30-35% of all production related emissions in the U.S. come from pneumatic controllers. There are between 500,000 and 600,000 wells that utilize intermittent pneumatic controllers in the U.S. There is thus a continuing need for improved power and air sources for remote well head pneumatic devices.

SUMMARY OF THE INVENTION

This invention relates to a process and apparatus that relies on fugitive or other gas to produce electrical power. Embodiments of this invention include or use a high efficiency thermoelectric generator (TEG) apparatus. The TEG system can be implemented for oil and gas field applications, and operated on fugitive gas to produce electrical power. The TEG apparatus provides a portable power system that can be used, without limitation, for operating pneumatic devices and/or other loads.

The invention includes an apparatus for producing electrical power, comprising a fuel and air mixture chamber, a combustor connected to the mixture chamber, and a plurality of thermoelectric couples and/or modules disposed axially along the combustor, wherein a temperature of combustion reduces along an axial length of the combustor. In embodiments of this invention, the combustor has a varying cross-sectional area along a length of a combustor chamber and/or the combustor has a rectangular cross section with the thermoelectric couples and/or modules on and along at least one side, and desirably all sides, of the combustor.

The invention further includes an apparatus for producing electrical power and including a fuel and air mixture chamber and a combustor connected to the mixture chamber. The combustor has a longitudinal centerbody with a varying cross-sectional area along an axial length of the centerbody. A plurality of thermoelectric couples and/or modules is disposed axially along at least one side, and desirably all sides, of the centerbody. A temperature within the centerbody reduces along the axial length of the centerbody.

The invention provides an efficient, compact, and reliable apparatus and method for producing power thermoelectrically from, for example, natural gas or other gaseous hydrocarbon feedstocks. Embodiments of the invention utilize a pre-mixed oxidant and fuel stream at a mixture ratio that provides a combustion temperature below the thermal NOx formation temperature and at the nominal operating temperature(s) of the thermoelectric devices. The pre-mix portion of the system is desirably isolated from the combustor via a flame arrestor device which prevents the flame from traveling back to the pre-mix section. Once combustion is complete, the hot gases are routed to a series of thermoelectric modules and/or couples desirably arrayed both radially and/or axially along the length of the combustor. Each thermoelectric module absorbs a portion of the heat, thereby reducing the gas temperature. It is desirable to maintain a constant heat flux into the TEG stack. To achieve this, the heat transfer film coefficient along the length can be increased to offset the reduction in the gas temperature. The thermoelectric modules are comprised of one or more pairs of thermoelectric couples (e.g., segmented) with the thermoelectric materials in each couple selected for the hot and cold side temperatures. Once the gases pass the last row of thermoelectric modules, the remaining heat in the gases can be recovered via a heat exchanger to preheat the incoming combustion air. An alternate configuration for a relatively constant temperature TEG would require a heat exchange to preheat the incoming combustion air to maintain high system efficiencies.

The invention further includes a method and device for providing remote or portable power. In embodiments of this invention, the device and its power output is used primarily for powering and operating a pneumatic device. The method of operating the pneumatic device according to embodiments of this invention includes: providing a fuel to a combustor; directing heated gases from the combustor a plurality of thermoelectric couples and/or modules; and powering an air compressor with the thermoelectric couples and/or modules to operate the pneumatic device. The TEG portable power system for this method can include a dry low-NOx (DLN) burner-driven TEG such as described above and herein, an air compressor, and any necessary power electronics. The air compressor according to some preferred embodiments of this invention is a DC-driven air compressor, thus eliminating the need for a DC inverter.

The heat for the TEG is provided by a small low NOx combustor to provide power (e.g., ~25 We) for remote gas and oil wellhead instrument air or other suitable power needs. The invention provides an instrument air system that is sufficiently low-cost to enable rapid adoption by the oil and gas industry for the retrofit of existing natural gas powered pneumatic devices. The apparatus and method of this invention enables operating pneumatic devices with air and eliminates gas emissions while providing an economically attractive and secure alternative. Current system evaluations indicate only 1/225th the amount of natural gas is used by the proposed system (based on average emissions per EPA 430-R-15-004) to generate the 25 We power commonly required for the instrument air to operate the pneumatic devices. Additionally, this small portion of natural gas is combusted, thus releasing carbon dioxide. Assuming the long-term GHG impact ratio of 28:1, this concept reduces GHG emissions from this source by three orders of magnitude, which translates to a 13-25% reduction in U.S. natural gas emissions from this source.

In addition to reducing GHG emissions, the proposed system has several unique attributes: (1) simple, reliable, and low-cost for retrofitting into numerous gas wells operating in the U.S.; (2) scalable to lower power (e.g., 25 We) as required for a majority of gas well operations, (3) reliable and robust unattended operation in widely distributed and remote areas; (4) secure profile for deployment that is less prone to theft at these remote sites than other technologies; and/or (5) high efficiency and low cost that directly translates to increased recoverable revenue.

DESCRIPTION OF THE ILLUSTRATED EMBODIMENTS

Figure 1:
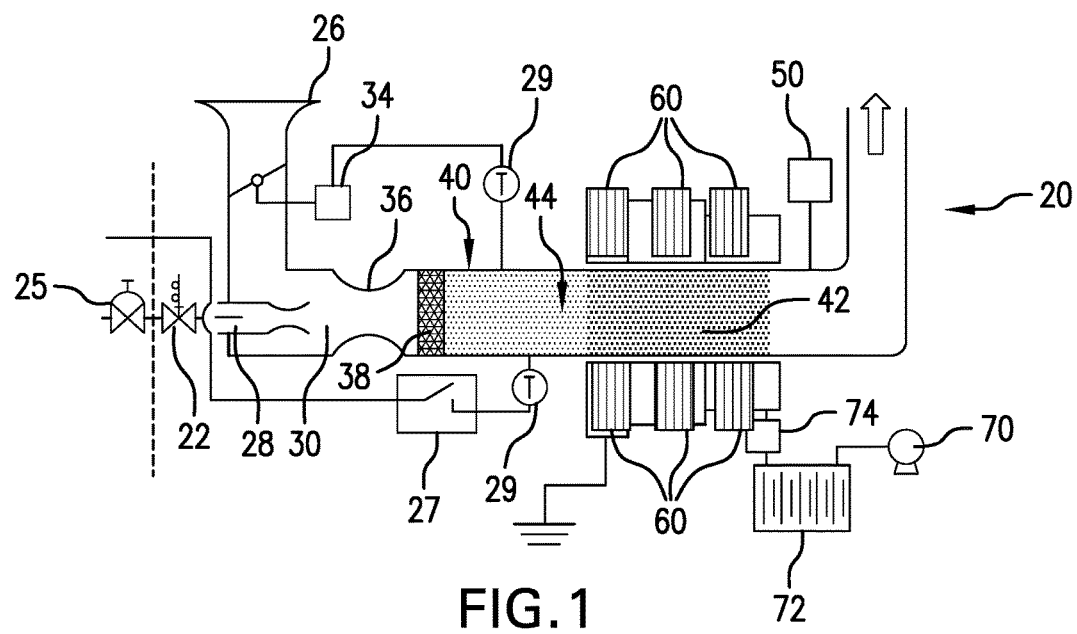
FIG. 1 schematically illustrates thermoelectric generator according to one embodiment of this invention.
Figure 2:
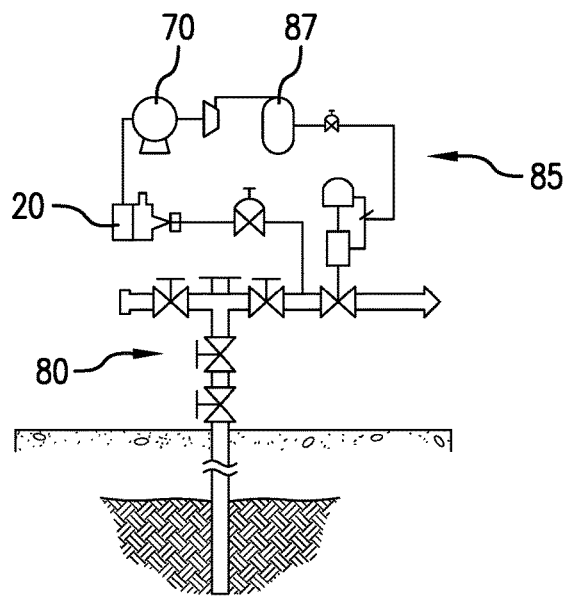
FIG. 2 schematically illustrates thermoelectric generator installed at a well pad, according to one embodiment of this invention.

FIG. 1 schematically illustrates a thermoelectric generator (TEG) 20 for producing electrical power according to one embodiment of this invention. The TEG can be implemented for oil and gas field applications, such as shown in FIG. 2, and operated on fugitive gas to produce electrical power. The TEG apparatus provides a portable power system that can be used, without limitation for operating pneumatic devices and/or other loads.

TEG 20 is connected to a gas source 25 by any suitable connection, such as including valve 22. TEG 20 includes a burner 24 having an air inlet 26 and a gas inlet 28 both in combination with a fuel and air mixture chamber 30. The air inlet 26 is desirably filtered and can include an air damper 32, such as controlled by rotary actuator controller 34. The gas inlet 28 can be any suitable inlet mechanism, such as a jet ejector adapted to vary fuel velocity, and the gas inlet 28 can be controlled, at least in part, by a controller and a thermal switch 27. Corresponding temperature sensors 29 provide information for automatically controlling the gas inlet 28 and the air damper 32, respectively.

The fuel and air mixture chamber 30 shown in FIG. 1 includes a throat diffuser 36. A combustor 40 is connected to the mixture chamber 30. A flame arrestor 38, such as a quench-type flame blowback preventer, is disposed between the mixture chamber 30 and the combustor 40. The combustor 40 includes a longitudinal centerbody 42 that encloses a combustion chamber 44. The longitudinal centerbody 42 and/or combustion chamber 44 can have any suitable size, shape or configuration, depending on need. For example, in embodiments of this invention, the centerbody and/or combustion chamber has a varying cross-sectional area along an axial length (e.g., increases or otherwise varies in passageway diameter along the length), and/or has a circular or rectangular cross section.

An exhaust duct 48 for combustion products is disposed at an end of the centerbody 42 opposite the chamber 30. In embodiments of this invention, a heat exchanger 50 can be included in combination with the combustor 40 and/or exhaust duct 48 at an end opposite the mixture chamber 30 to capture excess heat, such as for use in preheating incoming combustion air at or before the mixture chamber 30. Various and alternative heat exchanger structures can be implemented according to the device 20 design and need.

TEG 20 includes a plurality of thermoelectric modules and/or couples 60 disposed axially along the combustor 40 to convert the combustion heat into electrical energy. The thermoelectric modules and/or couples 60 can be disposed on one side of the combustor 40, but are desirably disposed along at least two sides, as shown in FIG. 1, and desirably all sides. Any suitable thermoelectric circuit component can be used according to this invention. Desirably, the plurality of thermoelectric modules and/or couples includes high temperature thermoelectric materials, such as Skutterudite alloys, that are able to be used with the adjacent burner and combustor (e.g., up to about 1100° C. (versus common TE materials typically around 290° C.)).

The plurality of thermoelectric modules and/or couples 60 desirably vary in thermoelectric materials and/or configuration along a length of the combustor 40, such as due to a temperature of combustion within the centerbody 42 reducing along an axial length of the combustor 40. Each thermoelectric module and/or couple 60 absorbs a portion of the heat, thus reducing the gas temperature. It is desirable to maintain a constant heat flux into the TEG stack. To achieve this, the heat transfer film coefficient of the modules 60 can be increased along the length to offset the reduction in the gas temperature. In embodiments of this invention, each the thermoelectric modules 60 includes pairs of segmented thermoelectric couples with the thermoelectric materials in each couple selected for the hot and cold side temperatures. In the embodiment shown in FIG. 1, the varying cross-sectional area (e.g., reducing, not increasing) of the combustor aids in maintaining a high heat flux at the thermoelectric modules 60.

Once the gases pass the last row of thermoelectric modules 60, the remaining heat in the gases can be recovered via the heat exchanger 50 to preheat the incoming combustion air. A control system is adapted to control a temperature at a first of the plurality of thermoelectric couples and/or modules, such as by control of the gas inlet 28 and/or the air inlet 26 to vary air and/or gas amounts at the burner 24.

The TEG of this invention can be implemented for oil and gas field applications, and operated on fugitive gas to produce electrical power. The TEG apparatus provides a portable power system that can be used, without limitation, for operating pneumatic devices and/or other loads, such as at a well pad 80 as shown in FIG. 2. In FIG. 2, the gas inlet and mixture chamber of the TEG 20 is connected to a natural gas outlet at the well pad 80. The TEG 20 powers an air compressor 70. The compressor 70, in turn, provides pneumatic power to operate air instrument systems 85, such as including a pneumatic control device 85 or other pneumatic device as are known in the art. The invention thus provides a method of operating a pneumatic device by providing a fuel (e.g., natural gas) from a source at the well pad to a TEG combustor, directing heated gases from the combustor to a plurality of thermoelectric couples and/or modules and powering an air compressor with the thermoelectric couples and/or modules to operate the pneumatic device.

The compressor can be any suitable air compressor, depending on need. Referring to FIG. 1, the TEG 20 is connected to the air compressor 70 by a battery 72 and a battery charger controller 74. In preferred embodiments of this invention, the air compressor is or includes a DC air compressor, thus eliminating the need for a DC inverter.

Thus the invention provides a dry low-NOx burner with an integrated thermoelectric generator that enables a power system that is small and high efficiency with several advantages. By enabling the heat flux to be essentially constant (gas velocity is inversely proportional to gas enthalpy), the system utilizes significantly less fuel and air, which reduces the size of the system. By varying the material in the thermoelectric couple for each thermoelectric module with respect to the gas enthalpy, the maximum power is extracted from the system. The reduced gas temperature eliminates handling of high temperature exhaust gases. All DC power for the unit allows for using a DC-driven air compressor without a DC inverter, although AC can alternatively be produced to create a mobile power station. The TEG is flexible and scalable across a wide power range, such as 10-1,000,000 watts.

Figure 3:
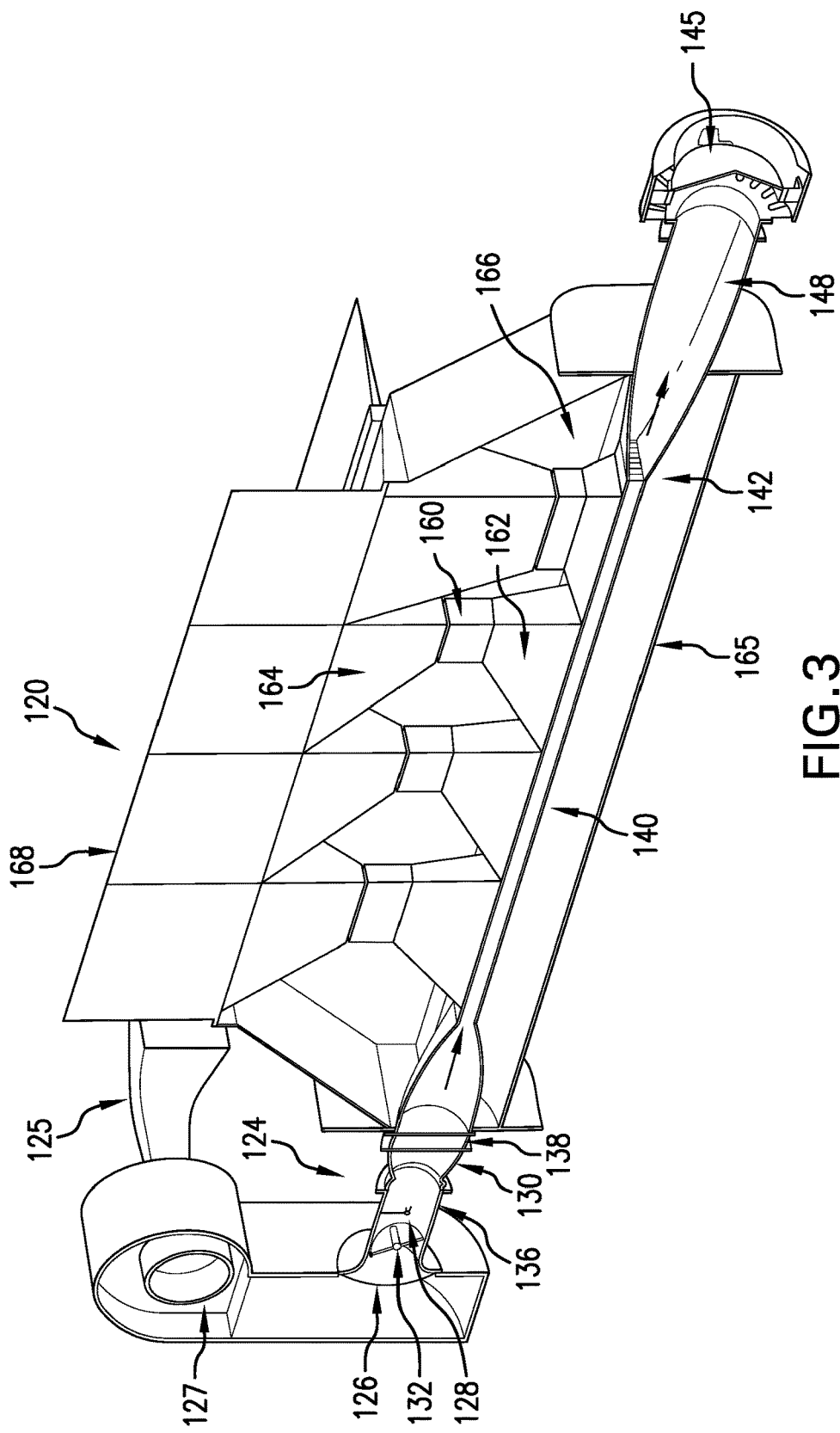
FIG. 3 is a sectional view of a thermoelectric generator according to one embodiment of this invention.

FIG. 3 illustrates a thermoelectric generator (TEG) 120 according to another embodiment of this invention. TEG 120 includes a burner 124 having a filtered air inlet 126 with an air damper 132. A gas inlet is embodied as a jet ejector 128. The air inlet 126 introduces air, such as from inlet plenum 125, and the jet ejector 128 introduces fuel into mixture chamber 130. The fuel and air mixture chamber 130 includes a reduced diameter throat diffuser 136, acting as a second ejector. A quench-type flame blowback flame arrestor 138 separates a burner/heat exchanger 140 from the mixture chamber 130. An optional forced draft fan 127 can be used to drive the air flow through the burner/heat exchanger 140.

The burner/heat exchanger 140 is embodied as a rectangular box with tapered fins to provide a varying flow cross-sectional area. A fin effect is applied to enhance the effective surface area and also increases the convective heat transfer by raising flow velocity. An exhaust duct 148 for combustion products is disposed at an end of the burner/heat exchanger 142 opposite the chamber 130 and includes an exhaust weather cap and/or thermal mixer 145.

TEG 120 includes a plurality of thermoelectric modules and/or couples 160 disposed axially along at least one side of burner/heat exchanger 140 to convert the combustion heat into electrical energy. The thermoelectric modules and/or couples 160 are grouped in rows disposed radially about the burner/heat exchanger 140. Each of the modules and/or couples 160 includes a hot side shoe 162 adjacent and in contact with outer surface of burner/heat exchanger 140, and a cold side shoe 164 disposed away from the burner/heat exchanger 140. The thermoelectric modules and/or couples 160 and the corresponding section of the burner/heat exchanger are disposed within enclosure 166, which can be internally insulated with, for example, microporous or nanoporous type insulation materials 165. Also, an inert cover gas (e.g., xenon) or vacuum is also applied to a hermetic enclosure for the thermoelectric devices. Heat rejection fins 168 extend from outer surface of enclosure 166 to aid in reducing the temperature at the cold shoe 164.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

What is claimed is:

1. An apparatus for producing electrical power, comprising:
   a mixture chamber to mix fuel and air to form a fuel air mixture;
   a combustor connected to the mixture chamber, the combustor to combust the fuel air mixture to produce combustion heat; and
   a plurality of thermoelectric modules disposed axially along the combustor, the thermoelectric modules each comprising a plurality of thermoelectric couples to convert the combustion heat into electrical energy, wherein a temperature of combustion reduces along an axial length of the combustor and wherein a constant heat flux from the combustor to the plurality of thermoelectric modules is maintained.

2. The apparatus of claim 1, further comprising a flame arrestor disposed between the mixture chamber and the combustor.

3. The apparatus of claim 1, wherein the combustor comprises a varying cross-sectional area along a length of a combustor chamber.

4. The apparatus of claim 3, wherein the combustor comprises a rectangular cross section with the thermoelectric modules on and along at least one side of the combustor.

5. The apparatus of claim 1, further comprising a heat exchanger in combination with the combustor at an end opposite the mixture chamber, wherein the heat exchanger preheats incoming combustion air at the mixture chamber.

6. The apparatus of claim 1, further comprising a jet ejector in combination with the mixture chamber, wherein the jet ejector is adapted to vary fuel velocity.

7. The apparatus of claim 1, wherein the plurality of thermoelectric modules comprises thermoelectric materials useable at temperatures of greater that 290° C.

8. The apparatus of claim 1, wherein the plurality of thermoelectric modules vary in thermoelectric materials along a length of the combustor.

9. The apparatus of claim 1, further comprising a control system adapted to control a temperature at a first of the plurality of thermoelectric modules.

10. The apparatus of claim 1, further comprising a natural gas source providing natural gas as the fuel.

11. The apparatus of claim 10, further comprising an air compressor powered by the thermoelectric modules.

12. The apparatus of claim 10, wherein the mixture chamber is connected to a natural gas outlet at a well pad.

13. The apparatus of claim 12, further comprising an air compressor connected to a pneumatic control device, wherein the air compressor is powered by the thermoelectric modules.

14. The apparatus of claim 13, further comprising a battery connected between the thermoelectric modules and the air compressor.

15. The apparatus of claim 13, wherein the air compressor comprises a DC air compressor.

16. An apparatus for producing electrical power, comprising:
   a mixture chamber to mix fuel and air to form a fuel air mixture;
   a combustor connected to the mixture chamber, the combustor to combust the fuel air mixture to produce combustion heat, the combustor including a longitudinal centerbody comprising a varying cross-sectional area along an axial length of the centerbody; and
   a plurality of thermoelectric modules disposed axially along at least one side of the centerbody, the thermoelectric modules each comprising a plurality of thermoelectric couples to convert the combustion heat into electrical energy, wherein a temperature within the centerbody reduces along the axial length of the centerbody and wherein a constant heat flux from the combustor to the plurality of thermoelectric modules is maintained.

17. The apparatus of claim 16, wherein the varying cross-sectional area comprises tapered fins extending and tapering along an axial length of the centerbody.

18. The apparatus of claim 1, wherein each thermoelectric module is spaced apart transverse the axial length and joined in heat transfer communication with the combustor by a respective hot side shoe, wherein the spacing apart of the thermoelectric modules from the combustor decreases along the axial length of the combustor.

19. The apparatus of claim 1, wherein each thermoelectric module is spaced apart transverse the axial length and joined in heat transfer communication with the combustor by a respective hot side shoe adjacent and in contact with an outer surface of the combustor, wherein the hot side shoes are of increasing surface area in contact with the outer surface of the combustor along the axial length of the combustor.

20. The apparatus of claim 1, wherein each thermoelectric module is spaced apart transverse the axial length and joined in heat transfer communication with the combustor by a respective hot side shoe adjacent and in contact with an outer surface of the combustor, wherein each hot side shoe has a lead edge along the axial length of the combustor whereat the temperature of combustion is greatest and a rear edge along the axial length of the combustor whereat the temperature of combustion is reduced, wherein the lead edge of each hot side shoe is spaced apart from the respective thermoelectric module by a distance that is greater than a distance by which the rear edge of the hot side show is spaced apart from the respective thermoelectric module.

\* \* \* \* \*